United States Patent [19]

Hyakutake

[11] Patent Number: 5,763,954
[45] Date of Patent: Jun. 9, 1998

[54] SEMICONDUCTOR DEVICE HAVING MULTILAYERED METAL INTERCONNECTION STRUCTURE AND MANUFACTURING METHOD THEREOF

[75] Inventor: Yasuhito Hyakutake, Hyogo, Japan

[73] Assignee: Mitsubishi Denki Kabushiki Kaisha, Tokyo, Japan

[21] Appl. No.: 639,325

[22] Filed: Apr. 25, 1996

[30] Foreign Application Priority Data

Aug. 10, 1995 [JP] Japan .................................. 7-204527

[51] Int. Cl.$^6$ .................... H01L 23/48; H01L 23/52; H01L 29/40
[52] U.S. Cl. .................. 257/774; 257/750; 257/752; 438/624
[58] Field of Search .................... 257/774, 752, 257/750, 757, 751, 760; 438/478, 479, 622, 624, 626, 761, 778

[56] References Cited

U.S. PATENT DOCUMENTS 5,278,451  1/1994  Adachi et al. .................... 257/790
5,416,359  5/1995  Oda .................................. 257/751
5,620,531  4/1997  Ikai et al. ......................... 257/40

Primary Examiner—Mahshid D. Saadat
Assistant Examiner—Jhihan B. Clark
Attorney, Agent, or Firm—McDermott, Will & Emery

[57] ABSTRACT

A highly reliable semiconductor device having superior flatness and highly precise pattern is obtained. A first metal interconnection 7a is formed on a semiconductor substrate 1. An interlayer insulating film 8a is provided on semiconductor substrate 1 to cover the first metal interconnection 7a. A second metal interconnection 7b is provided on the interlayer insulating film 8a. The interlayer insulating film 8a includes a first silicon oxide film 107a provided on semiconductor substrate 1 to cover the first metal interconnection 7a, and a second silicon oxide film 108a provided to fill concave portions at the surface of the first silicon oxide film 107a. Height of the interlayer insulating film 8a from the surface of the semiconductor substrate 1 is made uniform entirely over one chip.

3 Claims, 12 Drawing Sheets

SEMICONDUCTOR DEVICE HAVING MULTILAYERED METAL INTERCONNECTION STRUCTURE AND MANUFACTURING METHOD THEREOF

BACKGROUND OF THE INVENTION

1. Field of the Invention

The present invention generally relates to a semiconductor device having a multilayered metal interconnection structure and, more specifically, to a semiconductor device having a multilayered metal interconnection structure with improved flatness of an interlayer insulating film. The present invention also relates to a method of manufacturing such a semiconductor device having multilayered metal interconnection structure.

2. Description of the Background Art

Recently, semiconductor devices represented by dynamic random access memories (DRAMs), microprocessor unit (MPUS) and so on come to be ever and ever miniaturized and integrated to higher degree. Especially, in logic semiconductor devices such as MPU, there is a strong demand of higher speed of operation. For this reason, a technique for providing multiple layers of electrode interconnections connecting elements to each other has become essential.

Figure 9:
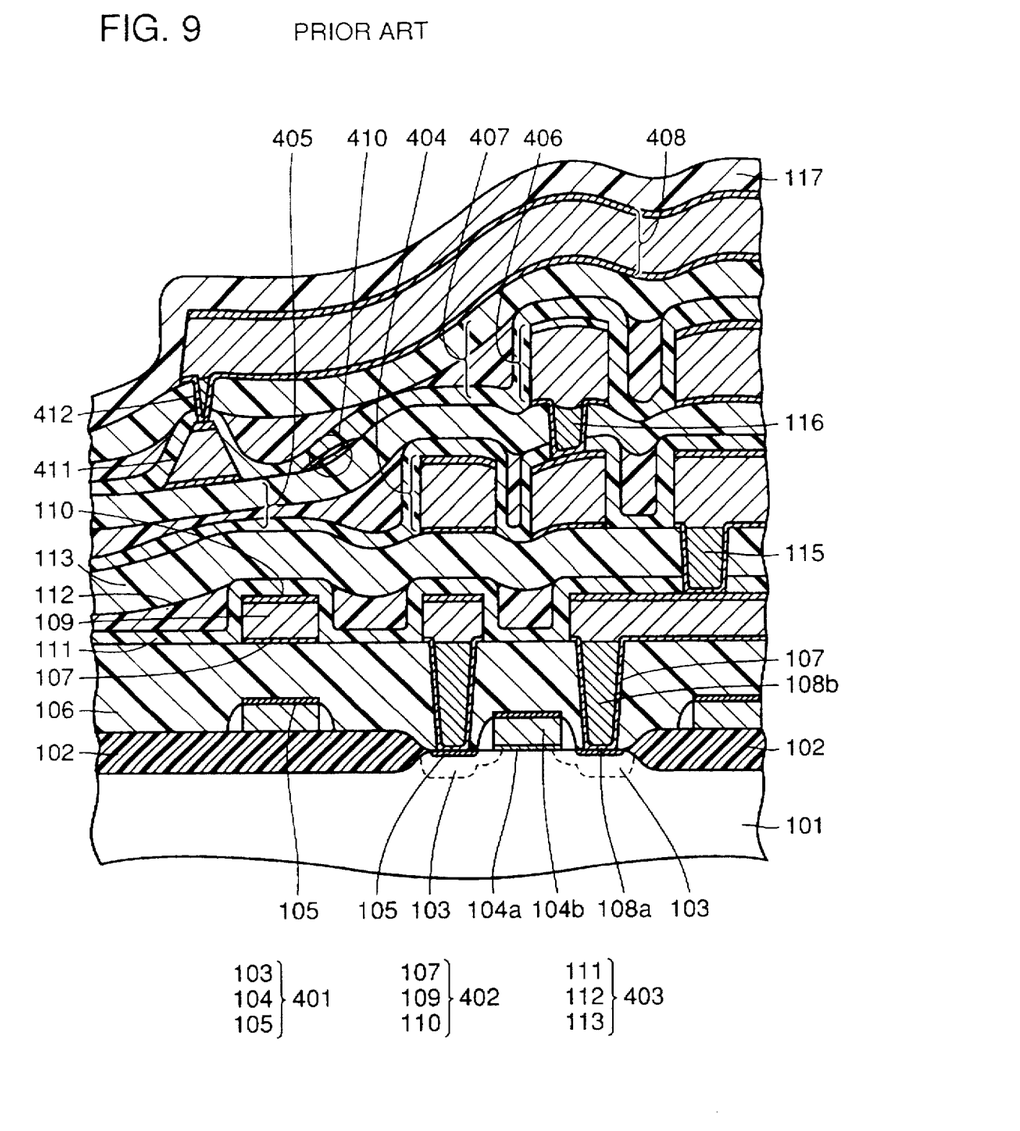
FIG. 9 is a cross section of a conventional semiconductor device having multilayered Al interconnection structure.

FIG. 9 is a cross sectional view of a conventional logic device.

Referring to FIG. 9, a conventional logic device includes a semiconductor substrate 101 formed of a P type Si single crystal. At a main surface of semiconductor substrate 101, there is provided a field oxide film 102 for separating an active region from another active region. In the active region, source/drain regions 103 doped with N type impurity are provided. Further, in the active region, a gate oxide film 104a and gate electrode 104b formed of polycrystalline silicon obtained by CVD method (chemical vapor deposition) are formed. In a device of which high performance is required, a salicide layer 105 is provided on source/drain regions 103 in order to reduce contact resistance. Salicide layer 105 is formed of a metal salicide layer (generally, $TiSi_2$, $CuSi_2$, $NiSi_2$ or the like) formed in self-alignment. In order to reduce resistance at gate electrode 104b, salicide layer 105 is also provided on gate electrode 104b.

Source/drain regions 103, gate oxide film 104a, gate electrode 104b and salicide layer 105 constitute an MOS (metal oxide semiconductor) transistor 401. One or a plurality of layers of metal interconnections for connecting transistors to each other are formed as needed. In the logic device shown in FIG. 9, there are four layers of metal interconnection, for example.

An interlayer insulating film 106 formed of BPSG (silicate glass including boron and phosphorus) or the like is formed on semiconductor substrate 101 to cover MOS transistor 401. In interlayer insulating film 106, a contact hole 107 for exposing a portion of the surface of source/drain region 103 is provided. In contact hole 107, an W plug 108b is provided, to be connected to source/drain region 103 with barrier metal 108a interposed. An interconnection 109 is provided on interlayer insulating film 106 to be in contact with W plug 108b. In order to pattern Al alloy interconnection 109 precisely and finely, an anti-reflection film 110 formed of TiN or the like is generally formed on Al interconnection 109.

A combination of contact hole 107, Al alloy interconnection 109 and anti-reflection film 110 will be hereinafter referred to as a first Al interconnection 402. A silicon oxide film 111 is formed on interlayer insulating film 106 by plasma CVD method, to cover the first Al interconnection 402. A silicon oxide film 112 referred to as spin on glass (hereinafter referred to as SOG) is provided to fill concave portions on the surface of silicon oxide film 111. On silicon oxide film 111, a second layer of silicon oxide film 113 formed by plasma CVD is provided. By a combination of silicon oxide films 111, 112 and 113, a first interlayer insulating film 403 having superior flatness and high electrical breakdown voltage is formed.

Thereafter, in the similar manner, a second Al interconnection 404, a third Al interconnection 406, a fourth Al interconnection 408, a second interlayer insulating film 405 and a third interlayer insulating film 407 are provided. On the uppermost layer of Al interconnection (the fourth Al interconnection 408 in FIG. 9), a passivation film 117 formed of a silicon oxide film, a silicon nitride film or a composite film thereof formed by plasma CVD is provided as a protection film.

The problems experienced by the conventional semiconductor device having multilayered interconnections will be described in the following.

Referring to FIG. 9, at a steep step denoted by the reference numeral 410, it is likely that residue remains at the time of etch back of tungsten and at the time of etching to form the pattern of Al interconnection. Such metal residue may cause short-circuit between interconnection, resulting in defective semiconductor devices.

Further, as denoted by reference numeral 411 in FIG. 9, part of the Al interconnection may be made thin, disconnected or made thick, resulting in short-circuit (in FIG. 9, an example of thinned interconnection is shown). Such thinning is derived from the fact that the step exceeds the depth of focus at the time of transfer and desired resist pattern could not be obtained because of this excess.

Further, as denoted by the reference number 412 in FIG. 9, there may be unsatisfactory opening of a via hole connecting upper and lower layers of Al interconnection, hindering satisfactory electrical connection. This is also caused by the step exceeding the depth of focus at the time of transfer, resulting in unsatisfactory resist pattern.

How the aforementioned problems occur will be described with reference to the flow chart of manufacturing the semiconductor device shown in FIG. 9.

Figure 10:
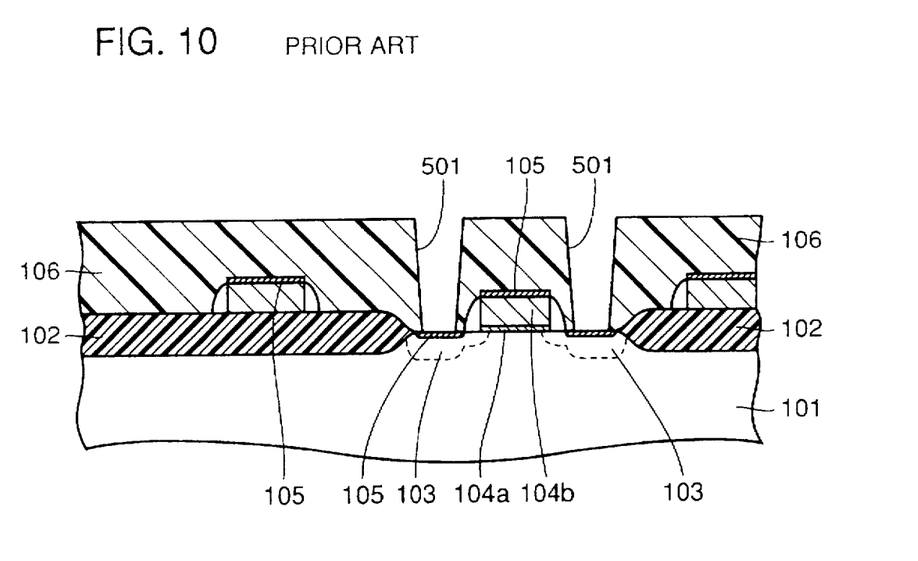
FIGS. 10 to 17 are partial cross sections of a semiconductor device showing first to eighth steps of manufacturing the conventional semiconductor device.

Referring to FIG. 10, on the main surface of P type silicon substrate 101, a field oxide film 102, source/drain regions 103, a gate electrode 104 of polycrystalline silicon, a salicide layer 105 of $TiSi_2$, $CoSi_2$ or the like and interlayer insulating film 106 formed of BPSG are formed. In interlayer insulating film 106, contact hole 501 for exposing a portion of the surface of source/drain regions 103 is formed. Contact hole 501 is formed by using the technique of transfer and etching.

Figure 11:
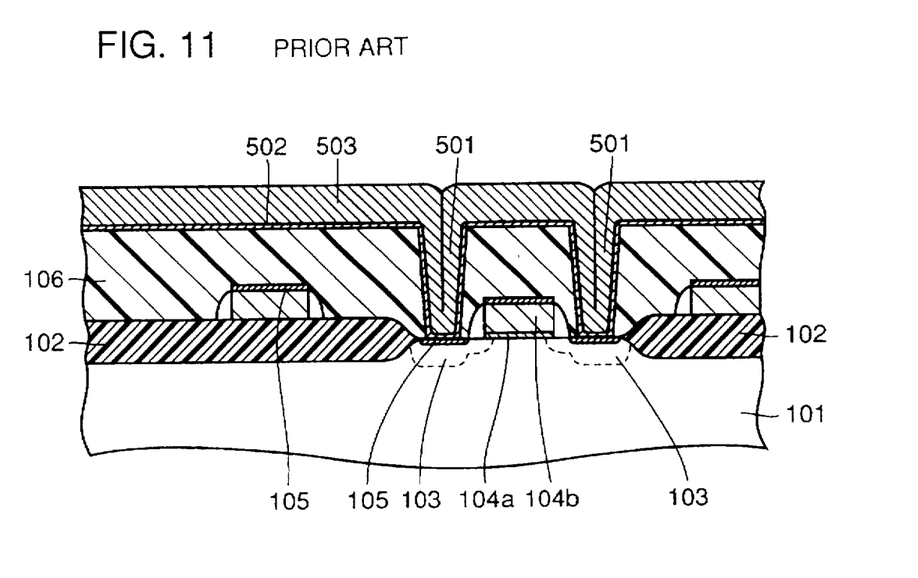

Referring to FIG. 11, a barrier metal 502 formed of TiN is provided by sputtering on silicon substrate 101, such that it is in contact with source/drain region 103 through contact hole 501. Barrier metal 502 serves as an adhesion layer to provide superior ohmic contact with silicon substrate to improve adhesion between W layer to be formed in the next step and the underlining interlayer insulating film. A W layer 503 is formed by CVD method on barrier metal 502 to fill contact hole 501. By setting the film thickness of W layer 503 to be at least the radius of contact hole 501, W layer 503 fully fills the contact hole 501.

Figure 12:
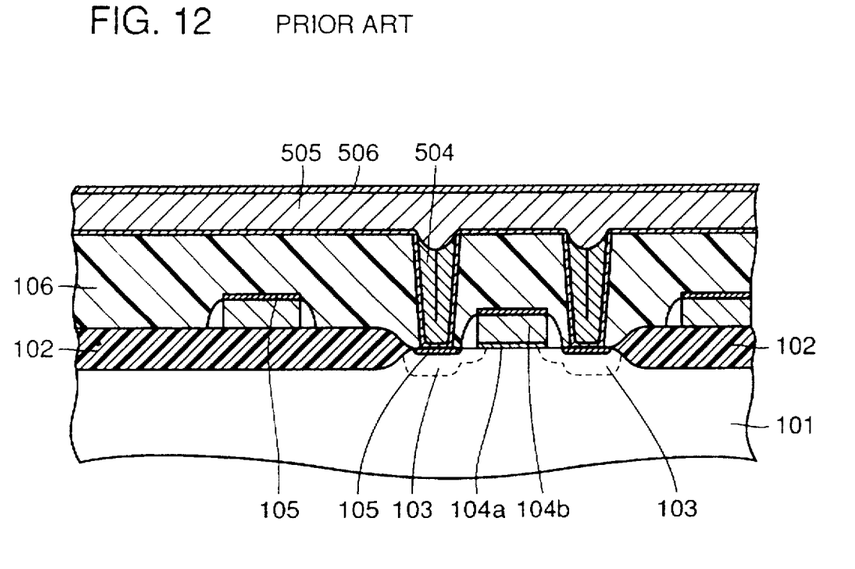

Referring to FIGS. 11 and 12, W layer 503 is etched back entirely by reactive iron etching (RIE method) using a gas of $SF_6$ or the like. This etching is stopped when the surface of barrier metal layer 502 appears, and thus a tungsten plug 504 is formed in contact hole 501, with W layer left only in the contact hole. After the formation of tungsten plug 504, an Al alloy layer 505 is formed by sputtering on silicon substrate 101.

For the Al type alloy 505, generally, an alloy such as Al-0.5 wt%Cu, Al-1wt%Si-0.5 wt%Cu or the like is used. A small amount of Cu is added in order to improve electromigration resistance of the interconnection. On Al alloy layer 505, an anti-reflection film 506 such as TiN is formed. Anti-reflection film 506 is to prevent halation at the time of transfer for forming Al interconnection, and hence to form highly precise fine interconnection. Appropriate film thickness of anti-reflection film 506 depends on the exposure apparatus (wavelength of the light source) and the resist. However, it is within the range of from 200 to 600 Å.

Figure 13:
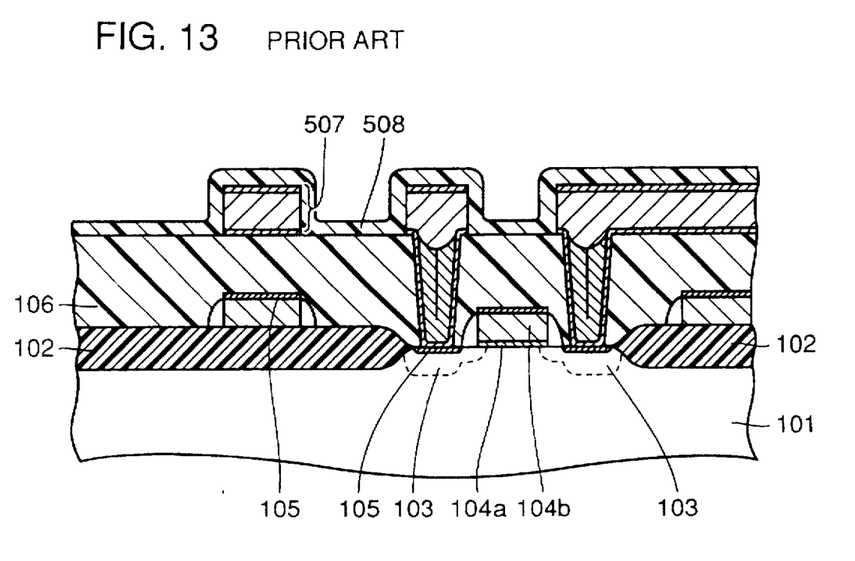

Referring to FIG. 13, by RIE method using a gas of $Cl_2$ or the like, a first Al interconnection 507 is formed. Thereafter, by plasma CVD method, an interlayer insulating film 508 is formed on silicon substrate 101 to cover the first aluminum interconnection 507. The interlayer insulating film 508 is formed by plasma CVD method using tetraethyl ortho silicate ($Si(OC_2H_5)_4$) (hereinafter referred to as TEOS) and $O_2$. As compared with a film formed by plasma CVD using silane ($SiH_4$) and $O_2$, this film has superior step coverage.

Figure 14:
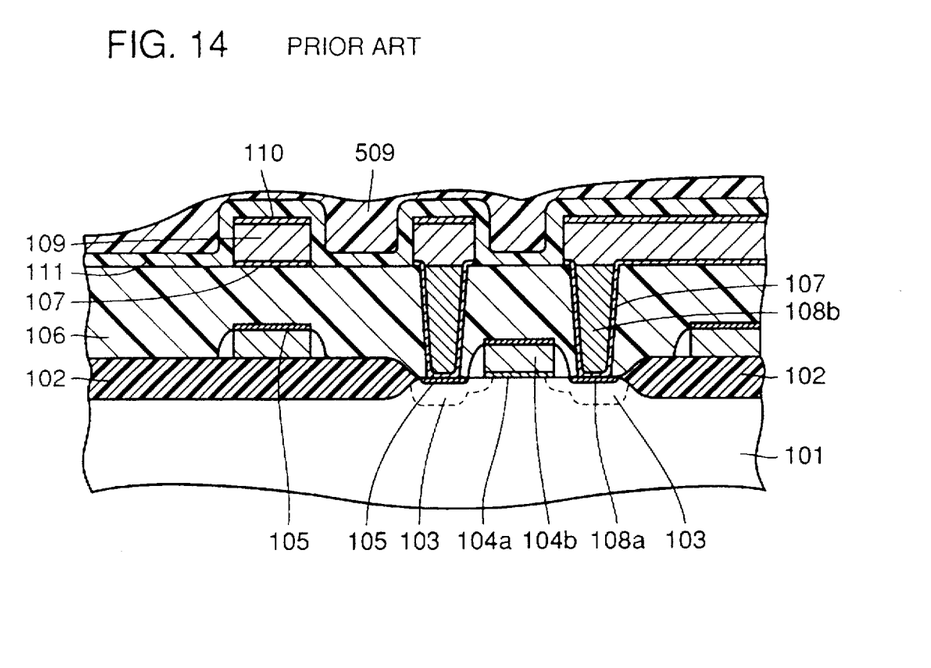

Referring to FIG. 14, SOG (509) is applied on silicon substrate 101 and calcined. SOG is a material including silanol ($Sl(OH)_4$) solved in alcohol, which is a solvent. SOG turns to silicon oxide film (hereinafter referred to as SOG layer) as it is applied and then calcined. Since SOG is in liquid phase when it is applied, it fills trenches of the pattern with priority. As a result, silicon oxide film is formed at first in the trench portions, an hence flatness can be improved.

Figure 15:
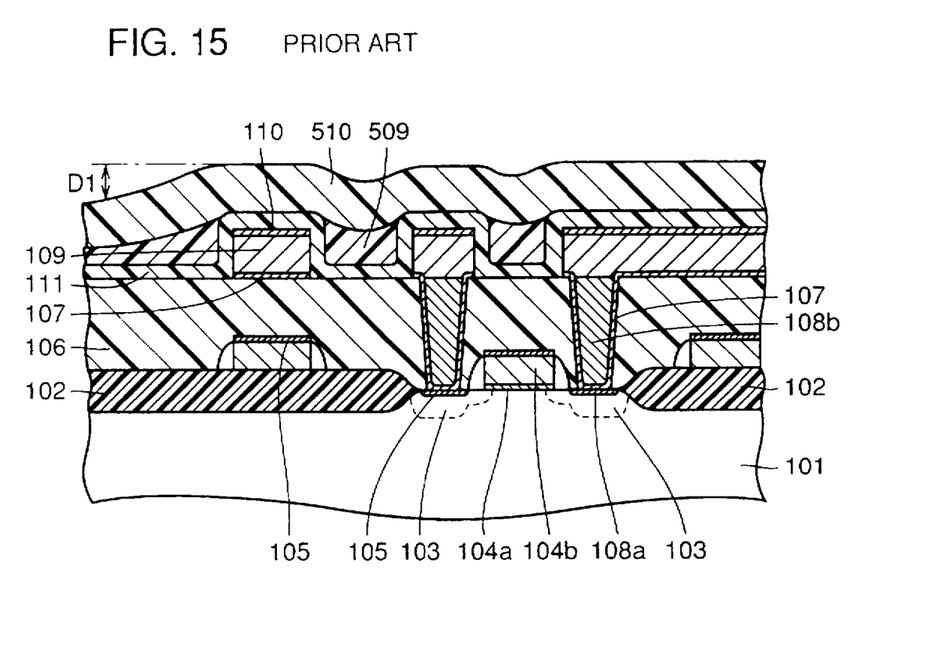

Referring to FIGS. 14 and 15, SOG layer 509 is etched back by RIE using a gas of $CF_4+CHF_3+O_2$ or the like. The reason why the etch back is carried out is as follows. More specifically, SOG film 509 has inferior film quality as compared with a film formed by conventional CVD method, electric breakdown voltage is inferior and gas is emitted from the film. Therefore, it is necessary to remove SOG layer 509 formed at portions other than the trench.

Thereafter, the first silicon oxide film layer 510 is formed again by plasma CVD, and thus a first interlayer insulating film between Al interconnections is formed.

Figure 16:
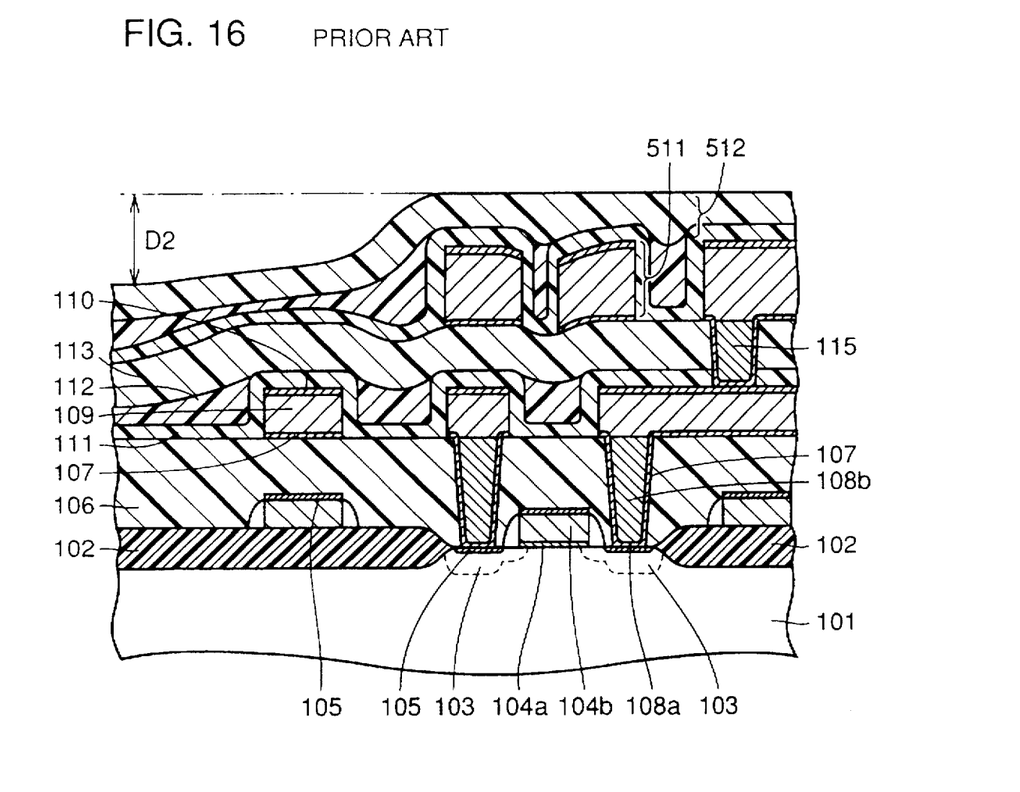

Referring to FIG. 16, in the similar manner, the second Al interconnection 511 and a second interlayer 15 insulating film 512 between Al interconnections are formed.

Figure 17:
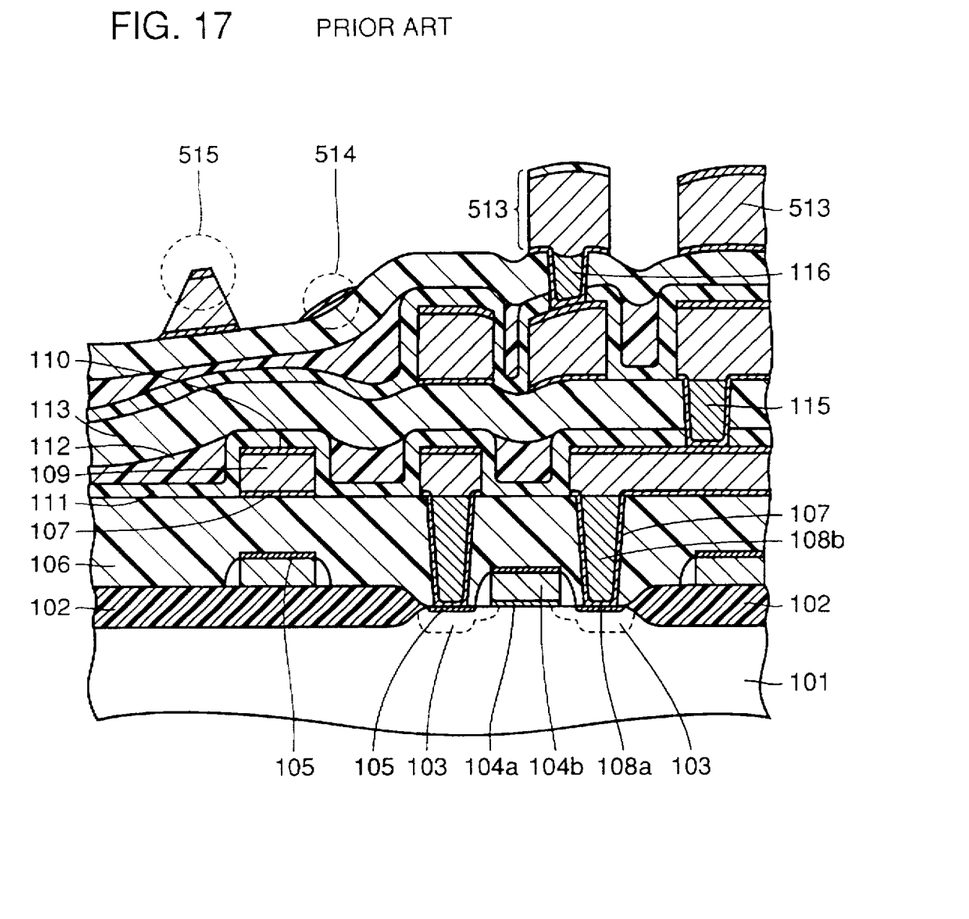

Then, referring to FIG. 17, on the first interlayer insulating film 512 between Al interconnections, a third Al interconnection 513 is formed.

The problem of the prior art will be described.

Referring to FIGS. 16 and 17, flattening of interlayer insulating film between Al interconnections utilizing SOG is effective in flattening portions which have dense Al pattern. However, when the Al pattern is not dense, there would be a step of Dl, for example, in the cross-section of FIG. 15. Further, when an interlayer insulating film between Al interconnection and upper layer of Al interconnection is formed, there would be a larger step denoted by $D_2$, as shown in FIG. 16. If the upper layer of Al interconnection is formed with such a large step of $D_2$ left as it is, the following problem occurs. Namely, referring to FIG. 17, when the third Al interconnection 513 is formed, there would be residue 514 of W layer at the step. The residue 514 causes short circuit between interconnections. Further, if the step D2 exceeds the depth of focus at the time of photolithography for forming interconnections, there would be defective pattern such as denoted by the reference numeral 515 in the figure.

SUMMARY OF THE INVENTION

The present invention was made to solve the above described problems and its object is to provide a highly reliable semiconductor device having high degree of flatness and highly precise patterns.

Another object of the present invention is to provide a method of manufacturing such a semiconductor device.

The semiconductor device having multilayered metal interconnection structure in accordance with a first aspect of the present invention includes a semiconductor substrate. On the semiconductor substrate, a first metal interconnection is provided. An interlayer insulating film is provided on the semiconductor substrate to cover the first metal interconnection. On the interlayer insulating film, a second metal interconnection is provided. The interlayer insulating film includes a first silicon oxide film formed on the semiconductor substrate to cover the first metal interconnection, and a second silicon oxide film provided on the first silicon oxide film to fill concave portions at the surface of the first silicon oxide film. The height of the surface of the interlayer insulating film from the surface of the semiconductor substrate in made uniform over the entire chip.

In the semiconductor device having multilayered metal interconnecting structure in accordance with a first aspect of the present invention, since the height of the surface of interlayer insulating film from the surface of the semiconductor substrate is made uniform entirely over each chip, the degree of flatness is high, highly precise patterns can be formed, and hence the semiconductor device has high reliability.

In the method of manufacturing a semiconductor device having multilayered metal interconnection structure in accordance with a second aspect of the present invention, a semiconductor substrate having a first metal interconnection provided thereon is prepared. On the semiconductor substrate, a first silicon oxide film is formed by plasma CVD method to cover the first metal interconnection. On the first silicon oxide film, a silicon ladder polymer film is applied. The silicon ladder polymer film is pressed from above, so that the surface of the device is made flat entirely. The silicon ladder polymer film is subjected to heat treatment. A second oxide film is formed on the semiconductor substrate to cover the silicon ladder polymer film. On the second silicon oxide film, a second metal interconnection is formed.

According to the method of manufacturing a semiconductor device having multilayered metal interconnection structure in accordance with the second aspect, since the silicon ladder polymer film is pressed from above and the surface of the device is made flat entirely, a highly reliable semiconductor device having high degree of flatness and highly precise patterns can be obtained.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Embodiments of the present invention will be described with reference to the figures.

First embodiment

Figure 1:
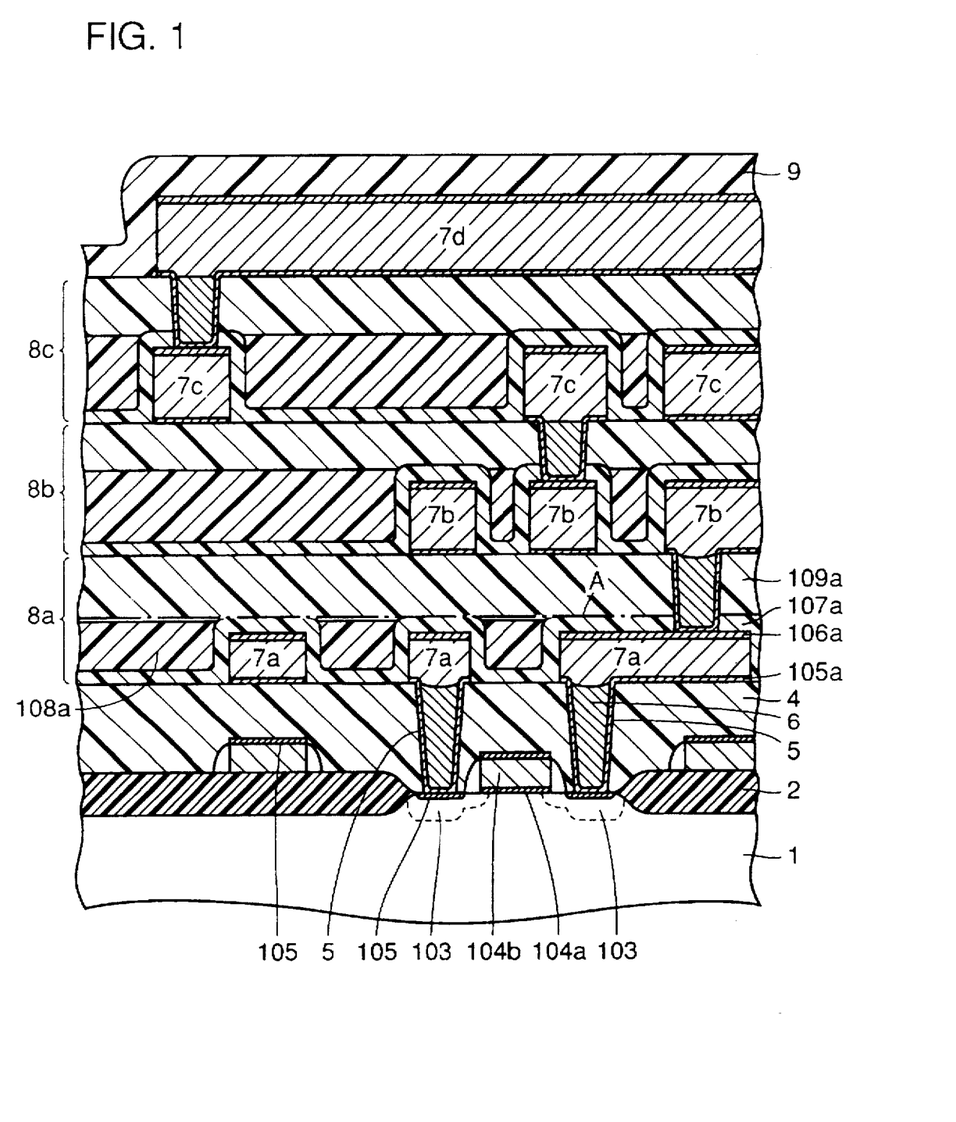
FIG. 1 is a cross section of a semiconductor device having a multilayered Al interconnection structure in accordance with a first embodiment of the present invention.

FIG. 1 is a cross section of a semiconductor device having multilayered Al interconnection structure in accordance with the first embodiment of the present invention. In FIG. 1, description of portions corresponding to those of the conventional device shown in FIG. 9 will not be repeated.

Referring to FIG. 1, at a main surface of a P type silicon substrate 1, a field oxide film 2 for isolating an active region from another is provided. On the active region, a gate oxide film 104a and gate electrode 104b of polycrystalline silicon are formed. In the surface of the active region on both sides of gate electrode 104, source/drain regions 103 which are diffused layers doped with impurity such as arsenic or phosphorous, are formed. On gate electrode 104b and source/drain regions 103, a salicide layer of $TiSi_2$, COSi, NiSi or the like formed in self-alignment to reduce electric resistance, i.e., a so-called salicide layer 105, is formed. Gate oxide 104a, gate electrode 104b, source/drain regions 103 and salicide layer 105 constitute a metal-oxide semiconductor (MOS)transistor 3.

On silicon substrate 1, an interlayer insulating film 4, for example, of BPSG is formed to cover MOS transistor 3. A contact hole 5 for exposing a part of the surface of source/drain regions 103 is formed in interlayer insulating film 4. A barrier metal 105a formed of metal having high melting point or composite film of such metals (for example, TiN, TiW, Ti, W, WSi, MoSi and composite film thereof) is formed to be in contact with inner wall surfaces and bottom surface of contact hole 5. A tungsten plug 6 is filled in contact hole 5 to be in contact with source/drain regions 103, with barrier metal 105a interposed. A first Al interconnection 7a is formed on interlayer insulating film 4 to be in contact with tungsten plug 6. On the first Al interconnection 7a, anti-reflection film 106a formed of a metal having high melting point or composite film of metals having high melting points is left, which is formed in order to prevent irregular reflection at the time of photolithography and to improve reliability of the first Al interconnection 7a. The first Al interconnection 7a is formed by an aluminum based binary or ternary alloy such as Al-Cu, Al-Si-Cu, Al-Cu-Ti, Al-Si or the like. A first interlayer insulating film (hereinafter referred to as first interaluminum film 8a) between Al interconnections is formed on interlayer insulating film 4 to cover the first Al interconnection 7a.

Since the structure and method of forming the first interaluminum film 8a are the most important features of the present invention, the structure and the method will be described in the following.

Referring to FIG. 1, a first silicon oxide film 107a formed by plasma CVD method is provided to cover the first Al interconnection 7a. To concave portions at the surface of the first silicon oxide film 107a, a second silicon oxide film 108a is filled. The second silicon oxide film 108a is formed by the steps of applying a silicon ladder polymer film, pressing, heat treating and etching back by reactive etching using $CF_4$, as will be described later.

The surface of the second silicon oxide film 108a formed through these steps is flush with the surface of the first silicon oxide film 107a. Namely, the surface denoted by the reference character A in the figure is approximately flat entirely over one chip.

The second silicon oxide film 108a contains 3 to 70 molar percent of a group selected from the group consisting of hydrogen atoms, lower alkyl group (for example methyl-group, ethyl-group, propyl-group, butyl-group, amyl-group), vinyl-group, allyl-group and phenylgroup.

On the flattened surface A, a third silicon oxide film 109a formed, for example, by plasma CVD is provided.

By superimposing the first, second and third silicon oxide films 107a, 108a and 109a, a first interaluminum layer 8a is formed. On the first interaluminum layer 8a, three layers of Al interconnection are further formed. More specifically, the semiconductor device shown in FIG. 1 includes second Al interconnection 7b, second interaluminum film 8b, a third Al interconnection 7c, a third Al interconnection 8c and a fourth Al interconnection 7d. The second, third and fourth Al interconnections 7b, 7c and 7d have the same structure as the first Al interconnection 7a, and the second and third interaluminum films 8b and 8c have the same structure as the first interaluminum film 8a. On the fourth aluminum interconnection 7d, a silicon nitride film 9 formed by plasma CVD method is formed as a protection film.

The method of manufacturing a semiconductor device having the multilayered Al interconnection structure in accordance with the present invention will be described. The description of steps which are the same as in the conventional manufacturing method will not be repeated.

Figure 2:
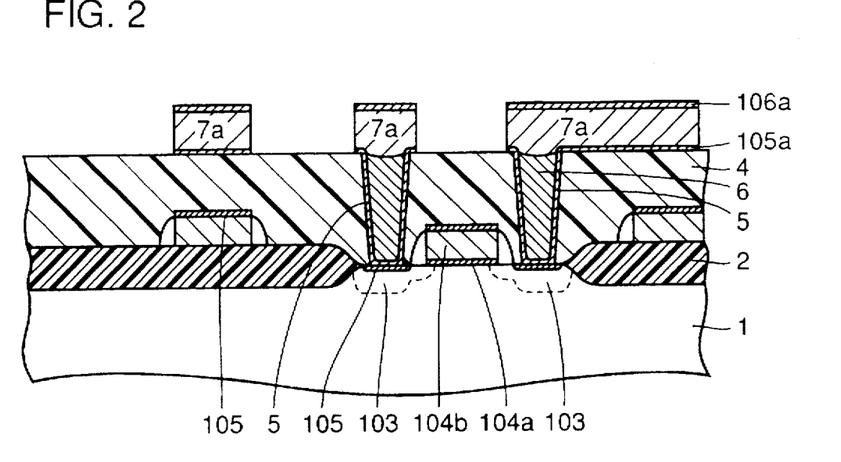
FIGS. 2 to 7 are partial cross sections of the semiconductor device showing first to sixth steps of manufacturing the semiconductor device in accordance with the first embodiment.

Referring to FIG. 2, the first Al interconnection 7a having a desired pattern is formed.

Figure 3:
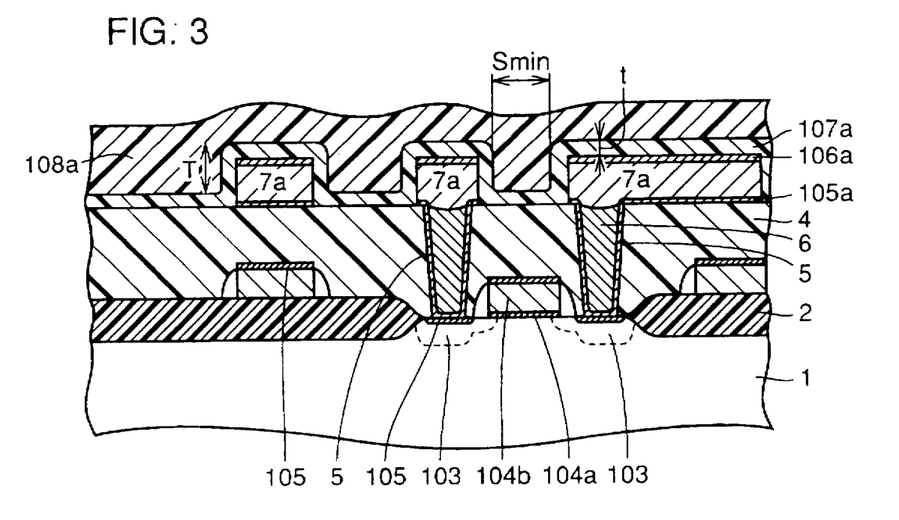

Referring to FIG. 3, the first silicon oxide film 107a is formed by plasma CVD method on interlayer insulating film 4 to cover the first Al interconnection 7a. The first silicon oxide film 107a is formed by plasma CVD method using tetra-ethyl-ortho-silicate ($Si(OC_2H_5)_4$ (hereinafter referred to as TEOS) and $O_2$(or $O_3$). The reason why the TEOS is used is that it has superior step coverage as compared with silane ($SiH_4$) and $O_2$ which are used when a silicon oxide film is formed by the CVD method. The thickness t of the first silicon oxide film 107a is determined by the pattern shape of the first Al interconnection 7a. More specifically, if the minimum space between the first aluminum interconnection 7a is $S_{min}$, the thickness t of the first silicon oxide film 107a must be $t \leq 1/2 S_{min}$. Namely, if $S_{min}=5000$Å, $t \leq 2500$Å. If this condition is not satisfied, the first silicon oxide film 107a would be joined at an upper portion, resulting in void.

Thereafter, on the first silicon oxide film 107a, a silicon ladder polymer 108a film is applied. The silicon ladder polymer film 108a has the following chemical formula.

In the formula above, R, $R_1$ and $R_2$ represent groups selected from the group consisting of hydrogen atoms, lower alkyl-group (for example, methyl-, ethyl-, propyl-, butyl- or amyl-group), vinyl-group, allyl-group and phenyl-group. R, $R_1$ and $R_2$ may or may not be the same group.

The integer n is selected such that weight-average molecular weight of silicon ladder polymer is from 2,000 to 200,000. If the weight-average molecular weight (Mw) is smaller than 2,000, generation of cracks is likely in the applied film after heat treatment. If the weight-average molecular weight exceeds 200,000, the type of usable solvent is limited, and viscosity of the solution is too high to handle.

The thickness of silicon ladder polymer film 108a have only to be the same or thicker than the step of the underlying layer. For example, if the maximum underlying step T=5,000 Å, 5,000 Å is sufficient as the thickness of silicon ladder polymer film 108a.

Figure 4:
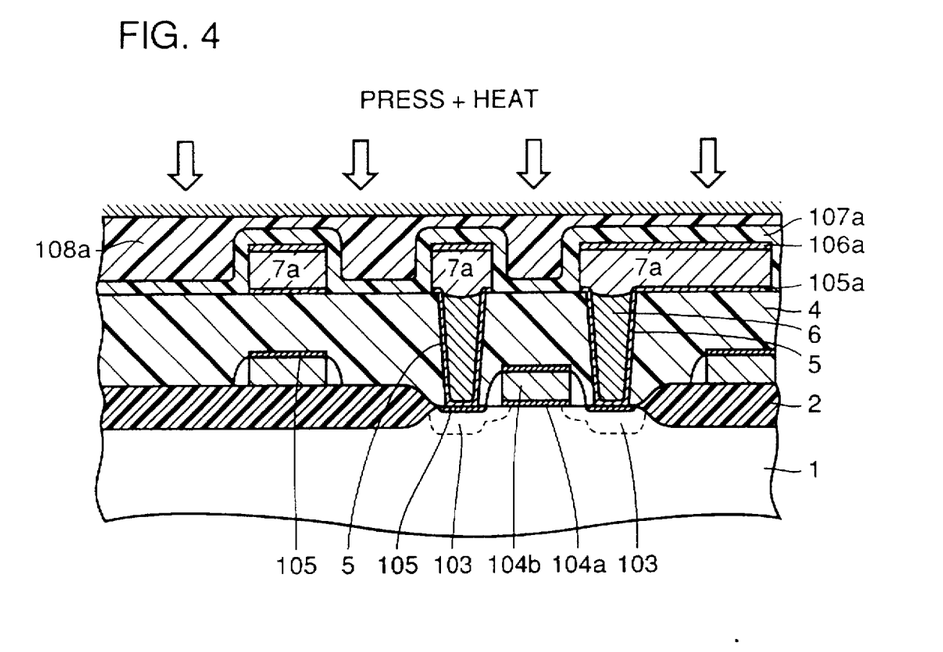

Referring to FIG. 4, silicon ladder polymer film 108a is pressed by means of a flat plate, from above the thus formed silicon ladder polymer film 108a. The pressure for pressing is preferably in the range of from 0.1 kgf/cm to 900 kgf/cm . If the pressure is not higher than 0.1 kgf/cm , sufficient flatness cannot be obtained. If the pressure exceeds 900 kgf/cm , Al interconnection would be damaged, as it exceeds yield stress of the underlying Al interconnection.

Simultaneously with pressing, heat treatment at a temperature of from 350° C. to 500° C. is performed, so as to cure the silicon ladder polymer film 108a. If the temperature is not higher than 350° C., silicon ladder polymer is not sufficiently cured, and component of solvent (for example, anisole, toluene or the lime) may be left. If heat treatment is performed at a temperature not lower than 500° C., silicon ladder polymer would be subjected to pyrolysis.

In the present embodiment, pressing is performed simultaneously with heat treatment. However, heat treatment may be formed at a later stage, and the heat treatment may be performed several times.

Further, pressing may be performed several times. The plate surface for pressing should preferably be coated by a fluorine type resin (for example, Teflon). This is because the fluorine type resin withstands high temperature and it has superior separation property with silicon ladder polymer film after pressing. By the step of pressing, the surface of the wafer is made completely flat because of silicon ladder polymer film 108a. The reason for this is that shrinkage ratio in volume of silicon ladder polymer is approximately 0% when the temperature of heat treatment is not higher than 500° C.

Figure 5:
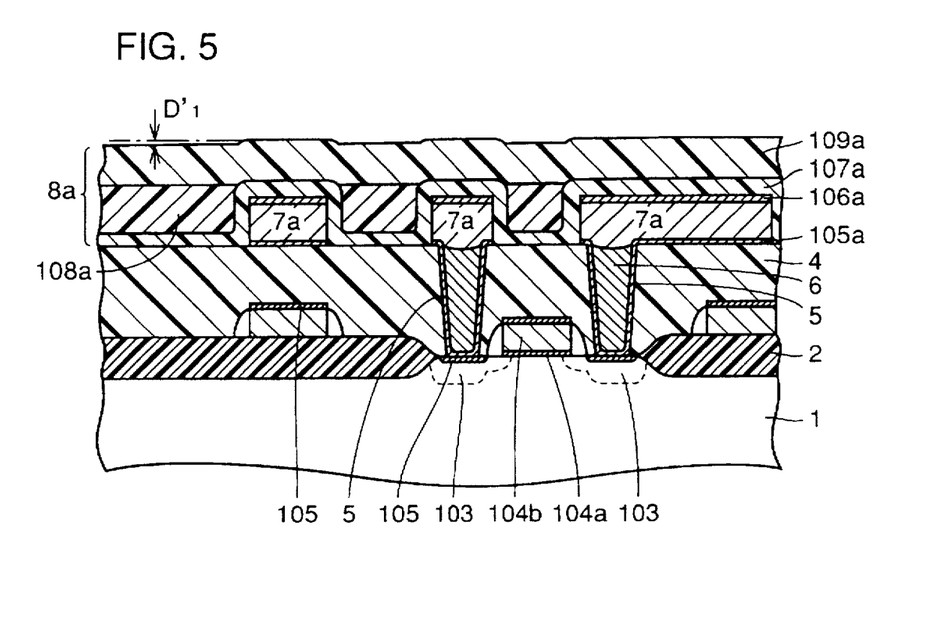

Referring to FIG. 5, the flattened silicon ladder polymer film 108a is etched back by RIE using a gas of $CF_4+CHF_3+O_2$ or the like. This is to prevent exposure as much as possible of silicon ladder polymer film 108a at side surfaces of via hole, when a via hole is to be opened in the later stage. Superior via hole connect is obtained if the silicon ladder polymer film is not exposed when the via hole is opened, and margin of reliability of via hole can be improved if the silicon ladder polymer film is not exposed. However, the step of etch back may be omitted.

Referring to FIG. 5, by plasma CVD method or the like using TEOS, silicon oxide film 109a is formed. Thus, the first interaluminum film 8a is completed.

In the step of forming the first interaluminum film 8a, there is a slight difference $D_1$ in level. However, if the etch rate of silicon ladder polymer film 108a is set to be the same as that of the first silicon oxide film 107a , the difference $D_1$ in level would be almost 0.

Figure 6:
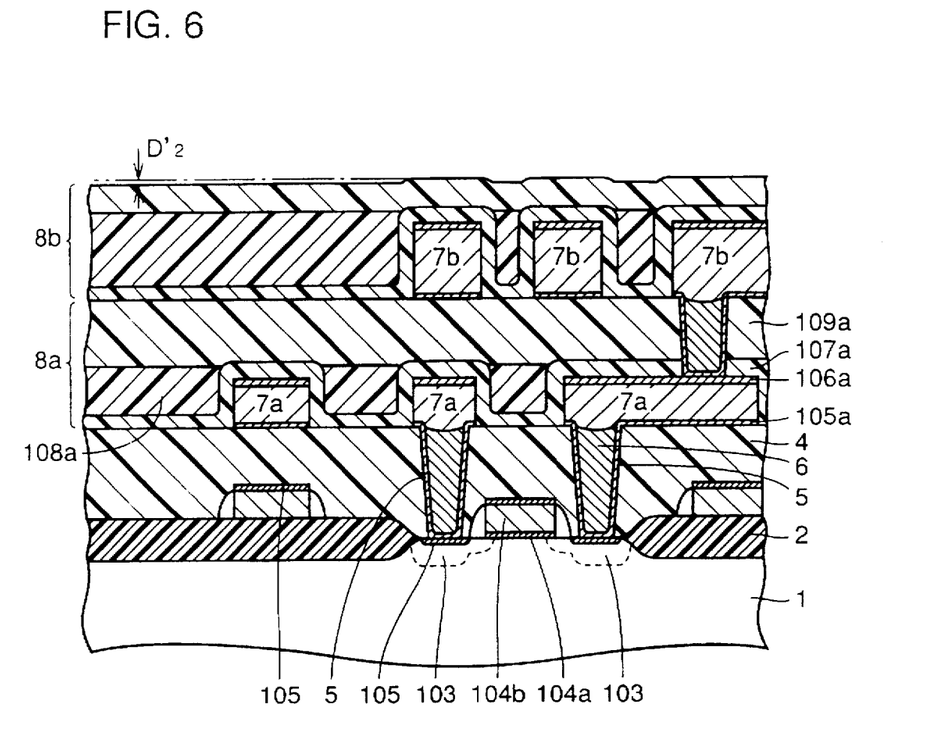

Referring to FIG. 6, the first viahole and the second Al interconnection 7b as well as the second interaluminum film 8b are formed in the similar manner. The difference $D_2$ in level generated at this time can also be made approximately 0.

Figure 7:
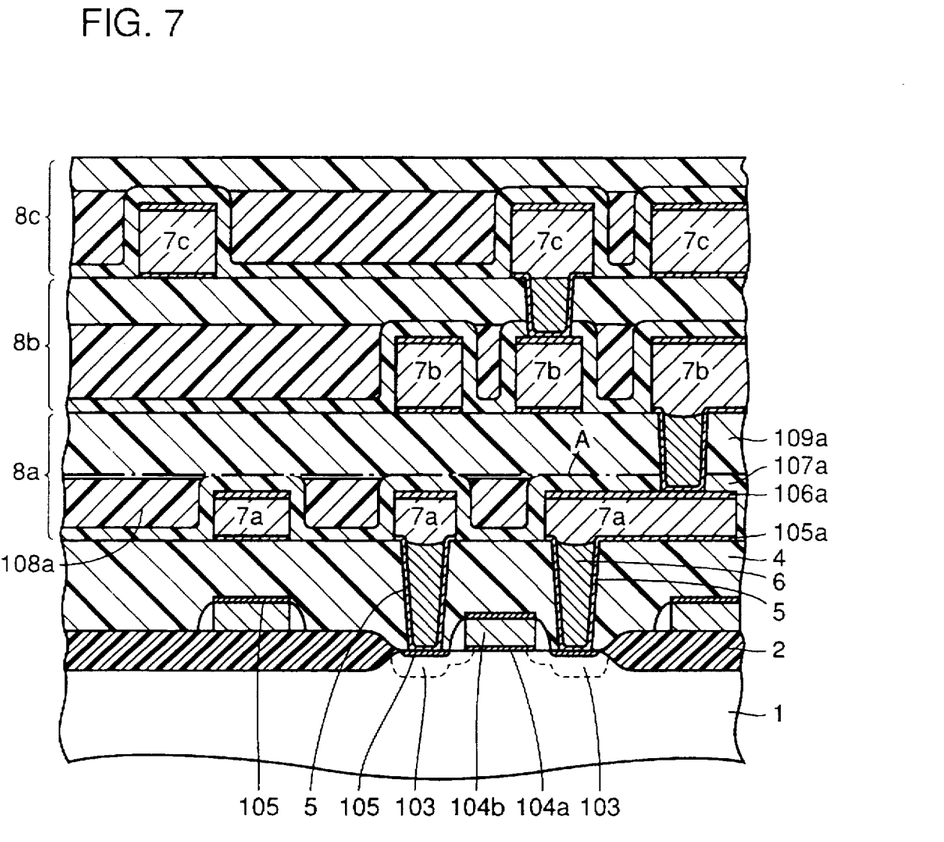

Referring to FIG. 7, thereafter, the third Al interconnection 7c and the third interaluminum film 8c can be formed in the similar manner with superior flatness.

Though not shown in the figure, the fourth and fifth layers of Al interconnection and interaluminum films can be formed in accordance with the embodiment of the present invention with superior flatness.

A formation of protecting film is the same as in the conventional method, and therefore description thereof is not repeated.

Table 1 shows examples of silicon ladder polymers w which can be suitably used in the present invention.

TABLE 1

|  | R1, R2 | R | n |
|---|---|---|---|
| Example 1 | phenyl (Ph) | hydrogen | integer allowing Mw of 150,000 |
| Example 2 | phenyl (Ph) | methyl | integer allowing Mw of 150,000 |
| Example 3 | phenyl (Ph) | ethyl | integer allowing Mw of 150,000 |
| Example 4 | methyl (Me) | hydrogen | integer allowing Mw of 80,000 |
| Example 5 | methyl (Me) | methyl | integer allowing Mw of 80,000 |
| Example 6 | methyl (Me) | ethyl | integer allowing Mw of 80,000 |
| Example 7 | hydrogen (H) | hydrogen | integer allowing Mw of 20,000 |
| Exa,ple 8 | hydrogen (H) | methyl | integer allowing Mw of 20,000 |
| Example 9 | hydrogen (H) | ethyl | integer allowing Mw of 20,000 |
| Example 10 | propyl | hydrogen | integer allowing Mw of 150,000 |
| Example 11 | propyl | methyl | integer allowing Mw of 150,000 |
| Example 12 | propyl | ethyl | integer allowing Mw of 150,000 |
| Example 13 | Ph/Me = 1/1 | hydrogen | integer allowing Mw of 10,000 |
| Example 14 | Ph/Me = 1/2 | hydrogen | integer allowing Mw of 10,000 |
| Example 15 | Ph/Me = 1/4 | hydrogen | integer allowing Mw of 10,000 |
| Example 16 | vinyl/Ph = 1/10 | hydrogen | integer allowing Mw of 80,000 |
| Example 17 | vinyl/Ph = 1/10 | vinyl | integer allowing Mw of 80,000 |

In the first embodiment, Al interconnection was described as an example of metal interconnection. However, in the present invention, metal interconnection may be formed up by other metals and high melting point metal silicide such as Cu, Ag, W, WSi, etc.

Second Embodiment

Figure 8:
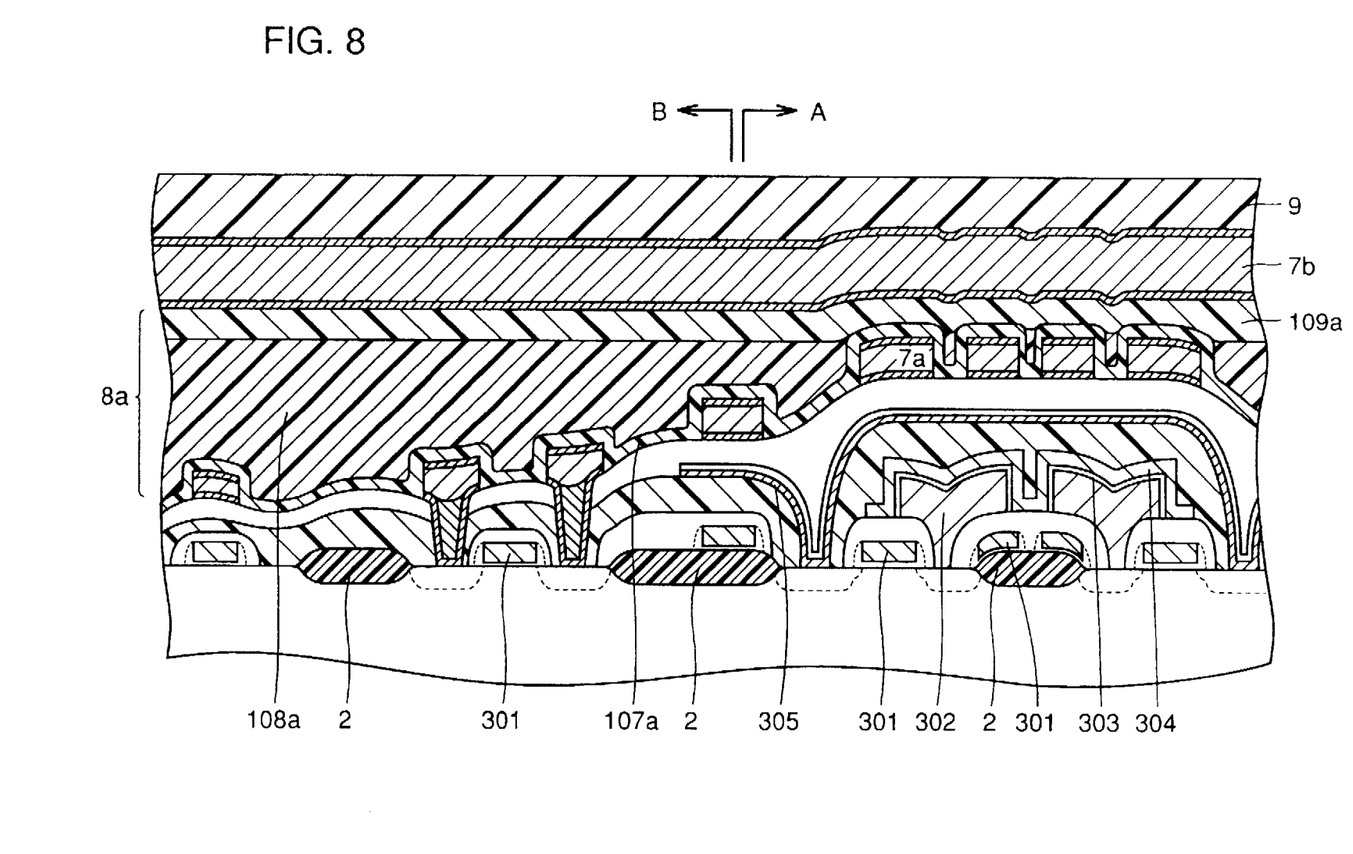
FIG. 8 is a partial cross section of a dynamic random access memory in accordance with a second embodiment.

FIG. 8 is a cross section of a dynamic random access memory (hereinafter referred to as DRAM) to which the present invention is applied.

In FIG. 8, the region denoted by the reference character A corresponds to a memory cell portion, and the region denoted by the reference character B corresponds to a peripheral circuit portion. An electrode 301 formed of polycrystalline silicon serves a as a word line in the memory cell. A storage node 302 is formed of polycrystalline silicon. A capacitor insulating film 303 is formed of a highly dielectric body represented by $SiO_2$, SiON, $Si_3N_4$ or $Ta_2O_5$. A cell plate 304 is formed of polycrystalline silicon. Storage node 300, capacitor insulating film 303 and cell plate 304 constitute a capacitor. A bit line 305 is formed of a composite film including polycrystalline silicon and metal salicide.

The DRAM in accordance with the second embodiment of the present invention includes a first Al interconnection 7a and a second Al interconnection 7b. The second Al interconnection 7b is formed on an interaluminum film 8a. The interaluminum film 8a has the same structure as interaluminum film 8a of the semiconductor device shown in FIG. 1. The height of the surface of interaluminum film 8a from the surface of silicon substrate 101 is made uniform entirely over one chip. On the second aluminum interconnection 7b, a protection film 9 of $Si_3N_4$ is formed. In the DRAM, a large step is likely at a boundary between the memory cell portion and the peripheral circuit portion. In the present embodiment, silicon ladder film is formed to fill the lower portion, which is pressed, and interaluminum film 8a is formed. Therefore, a highly reliable DRAM having superior flatness and highly precise pattern can be obtained.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A semiconductor device having multilayered metal interconnection structure, comprising:

a semiconductor substrate;

a first metal interconnection provided on said semiconductor substrate;

an interlayer insulating film formed on said semiconductor substrate to cover said first metal interconnection; and a second metal interconnection provided on said interlayer insulating film; wherein said interlayer insulating film includes a first silicon oxide film provided on said semiconductor substrate to cover said first metal interconnection, said first silicon oxide film having an upper surface and a concave portion, and a second silicon oxide film having an upper surface and formed on the first silicon oxide film and filling in the concave portion so that the upper surface of the second silicon oxide film is substantially flush with the upper surface of the first silicon oxide film; and the height of a surface of said interlayer insulating film from a surface of said semiconductor substrate is made uniform entirely over one chip, wherein said second silicon oxide film includes 3 to 70 molar percent of a group selected from the group consisting of hydrogen atoms, lower alkyl-group, vinyl-group, allylic-group and phenyl-group.

2. The semiconductor device having multilayered metal interconnection structure according to claim 1, wherein said second silicon film is formed of a silicon ladder polymer having a chemical structure represented by the following chemical formula:

where R, $R_1$, $R_2$ represent a group selected from the group consisting of hydrogen atoms, lower alkyl-group, vinyl-group, allylic-group and phenyl-group and n represents an integer.

3. The semiconductor device having multilayered metal interconnection structure according to claim 2, wherein said integer n is selected such that weight-average molecular weight of said silicon ladder polymer is within a range of from 2,000 to 200,000.

* * * * *